(12) United States Patent
Hui

(10) Patent No.: US 8,914,052 B2
(45) Date of Patent: Dec. 16, 2014

(54) BACKHAUL SIGNAL COMPRESSION THROUGH SPATIAL-TEMPORAL LINEAR PREDICTION

(75) Inventor: Dennis Hui, Sunnyvale, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 789 days.

(21) Appl. No.: 13/010,432

(22) Filed: Jan. 20, 2011

(65) Prior Publication Data

US 2012/0190389 A1 Jul. 26, 2012

(51) Int. Cl.
*H04B 7/00* (2006.01)
*H04B 7/02* (2006.01)
*H03M 7/30* (2006.01)
*H04W 88/08* (2009.01)
*H04B 7/04* (2006.01)

(52) U.S. Cl.
CPC .......... *H03M 7/3082* (2013.01); *H04W 88/085* (2013.01); *H04B 7/024* (2013.01); *H03M 7/3073* (2013.01); *H03M 7/3075* (2013.01); *H04B 7/0413* (2013.01)
USPC .......... 455/500; 382/240; 370/210; 370/480; 375/240.18; 375/240.2; 375/240.25

(58) Field of Classification Search
USPC ................. 455/500; 382/240; 370/210, 480; 375/240.3, 240.18, 240.2, 240.25
See application file for complete search history.

(56) References Cited

U.S. PATENT DOCUMENTS

| | | | | |
|---|---|---|---|---|
| 7,983,623 B2* | 7/2011 | Balachandran et al. | ........ | 455/69 |
| 8,208,397 B2* | 6/2012 | Cheng et al. | .................. | 370/252 |
| 8,331,481 B2* | 12/2012 | Lee et al. | ...................... | 375/295 |
| 8,442,449 B2* | 5/2013 | Hui et al. | ......................... | 455/69 |
| 8,526,891 B2* | 9/2013 | Balachandran et al. | ......... | 455/69 |
| 8,542,573 B2* | 9/2013 | Liu et al. | ........................ | 370/210 |
| 2003/0142875 A1* | 7/2003 | Goertzen | ........................ | 382/240 |
| 2008/0025416 A1* | 1/2008 | Jafarkhani et al. | ............. | 375/245 |
| 2009/0016425 A1 | 1/2009 | Hui | | |
| 2009/0164223 A1* | 6/2009 | Fejzo | ............................ | 704/500 |
| 2011/0135013 A1* | 6/2011 | Wegener | ........................ | 375/241 |
| 2011/0211549 A1* | 9/2011 | Au et al. | ........................ | 370/329 |
| 2011/0222791 A1* | 9/2011 | Mansour | ....................... | 382/240 |
| 2012/0082117 A1* | 4/2012 | Lee et al. | ...................... | 370/329 |
| 2012/0243468 A1* | 9/2012 | Hui et al. | ...................... | 370/328 |

FOREIGN PATENT DOCUMENTS

WO  WO 98/54850  12/1998

OTHER PUBLICATIONS

P. Marsch et al.; "On Uplink Network MIMO Under a Constrained Backhaul and Imperfect Channel Knowledge", Communications, 2009, ICC '09. IEEE International Conference ON, Jun. 14, 2009, pp. 1-6, XP031506246.
International Search Report and Written Opinion, mailed Jun. 4, 2012, in International Application No. PCT/IB2012/050284.
Gersho et al., *Chapter 9: Entropy Coding*, Vector Quantization and Signal Compression, 1995, pp. 259-305.
Riskin, *Optimal Bit Allocation via the Generalized BFOS Algorithm*, IEEE Transaction on Information Theory, vol. 37, No. 2, Mar. 1991, pp. 400-402.
International Preliminary Report on Patentability mailed Jul. 23, 2013 with Written Opinion of the International Search Authority.

* cited by examiner

*Primary Examiner* — Bobbak Safaipour
(74) *Attorney, Agent, or Firm* — Nixon & Vanderhye P.C.

(57) ABSTRACT

The technology in this application compresses multi-antenna complex-valued signals by exploiting both a spatial and a temporal correlation of the signals to remove redundancy within the complex-valued signals and substantially reduce the capacity requirement of backhaul links. At a receiver, the compressed signal is received, and a decompressor decompresses the received signal over space and over time to reconstruct the multiple antenna stream.

44 Claims, 5 Drawing Sheets

BACKHAUL SIGNAL COMPRESSION THROUGH SPATIAL-TEMPORAL LINEAR PREDICTION

TECHNICAL FIELD

The technical field relates to communications, and more particularly, to data compression in order to communicate more information for a given amount of communication resources.

BACKGROUND

The exponential growth in the demand for wireless data communications has put tremendous pressure on cellular network operators to improve the capacity of their communication networks. To improve the spectral efficiency of these networks, scarce radio resources need to be reused aggressively in neighboring cells. As a result, inter-cell interference is a significant source of signal disturbance, limiting both the service quality of cell-edge users and overall system throughput.

Coordinated multi-point (CoMP) transmission or reception is one promising option because of its promise to effectively mitigate inter-cell interference. The idea behind CoMP in the downlink is to connect multiple remote base-stations via certain backhaul communication links from several adjacent cells to a central processor (CP) to form a "super-cell," or a CoMP cluster, such that transmission to or reception from multiple user equipments (UEs) within each CoMP cluster can be coordinated by the central processor to reduce or even avoid mutual interference among UEs. The benefit attainable by the deployment of CoMP depends on how well that coordination can be performed by the CP.

To enable the central processor to effectively coordinate transmission and/or reception at multiple cells, signal information must be communicated between remote base station sites and CP in a timely fashion. But the amount of information that must be sent to or received from each remote site can be overwhelming, especially when multiple antennas are deployed at each site. For example, in the Common Public Radio Interface (CPRI), each real-valued sample of the IQ (complex-valued) backhaul signal is simply quantized independently by a fixed number of bits (e.g., 15 bits). It does not exploit any structure of the underlying backhaul signal and is an inefficient way of representing wireless communication signal. This puts an unnecessarily large burden on the capacity of backhaul links. What is needed is an effective method to compress those multi-antenna signals with both in-phase (I) and quadrature-phase (Q) components for each antenna branch.

SUMMARY

The technology in this application compresses multi-antenna complex-valued signals by exploiting both a spatial and a temporal correlation of the signals to remove redundancy within the complex-valued signals and substantially reduce the capacity requirement of backhaul links. At a receiver, the compressed signal is received, and a decompressor decompresses the received signal over space and over time to reconstruct the multiple antenna streams.

One aspect of the technology relates to a compression method for compressing information in signals received at multiple antennas. The received multiple antenna signals are decorrelated over space and over time to generate a compressed signal, which is transmitted to a receiving node.

In one non-limiting example implementation, the multiple antenna signals are part of a coordinated multi-point communication, and the transmitting is from or towards multiple geographically separated locations over one or more backhaul communications links. The multiple antenna signals are complex-valued and sampled.

In a preferred example embodiment, the decorrelating includes generating predictions of the multiple antenna signals, which in an example implementation includes finite impulse response (FIR) filtering. Associated error signals between the predicted multiple antenna signals and corresponding ones of the received multiple antenna signals are determined to remove time correlation from the received multiple antenna signals, and the error signals are used to generate the compressed signal. The error signals are transformed using a linear spatial transformation into spatially-transformed errors to remove correlation in space across different antennas in the received multiple antenna signals. Each of the spatially-transformed errors is then quantized such that the compressed signal includes the quantized, spatially-transformed errors.

The spatial linear transform may use fixed, predetermined transform coefficients corresponding for example to a discrete-cosine transform (DCT), a discrete Fourier transform (DFT), or a discrete wavelet transform (DWT). Alternatively, the spatial linear transform includes adaptively computed transform coefficients, in which case, the adaptive transform coefficients are sent to the receiving node. One non-limiting example is a spatial linear transform that includes transform coefficients corresponding to a Kahunen-Loeve transform (KLT).

The spatially-transformed errors may be quantized using a predetermined or adaptively selected number of bits. And one or more of the spatially-transformed errors may not quantized if desired. If a predetermined, fixed number of bits is used the same number of bits may be used to quantize all spatially transformed errors. If an adaptively computed number of bits is used, that adaptively computed number may depend on corresponding variances of the spatially-transformed errors over time such that a larger number of bits is allocated for quantizing a spatially-transformed error with a larger corresponding variance, and a smaller number of bits is allocated for quantizing a spatially-transformed error with a smaller corresponding variance. In one example embodiment, a Breiman-Friedman-Olshen-Store (BFOS) algorithm may be used to allocate bits for quantizing the spatially-transformed errors. In another example embodiment, bits are allocated according to a logarithm of the variances of the spatially transformed errors for quantizing the spatially-transformed errors. The adaptively selected bit allocations for the spatially-transformed errors may be sent to the receiving node.

The spatially-transformed errors may be quantized in an example embodiment using variable-rate quantizers. Moreover, spatially-transformed errors may be quantized using quantizers with uniform step or cell sizes. The output of those quantizers with uniform step or cell sizes may then be encoded using entropy encoders.

In an example embodiment, an error covariance matrix is calculated for the spatially-transformed errors using an empirical moving average computed over a window of time samples of the error signals. The eigen-decomposition of the error covariance matrix is determined, and the resulting eigen-vectors from the eigen-decomposition are used to form a KLT coefficient matrix. The KLT coefficient matrix may be sent to the receiving node.

The filtering may performed using a matrix of predictive coefficients. In one example implementation, a matrix of predictive coefficients may be estimated using empirical moving averages of (1) a cross-correlation of the multiple antenna signals and the quantized antenna signals and (2) an auto-correlation of the quantized antenna signals. In another example, the matrix of predictive coefficients may be estimated using recursive empirical averages of (1) a cross-correlation of the multiple antenna signals and the quantized antenna signals and (2) an auto-correlation of the quantized antenna signals. In either case, the matrix of predictive coefficients may be sent to the receiving node.

Another aspect of the technology includes a decompression method. A compressed signal that corresponds to a multi-antenna signal, the multi-antenna signal including information associated with a user communication received over multiple antennas, is received and decompressed based on one or more correlations in space and in time to reconstruct a representation of the multi-antenna signal. The reconstructed representation of the multi-antenna signal is then provided for further processing or output. The reconstructed representation of the multi-antenna signal is complex-valued, sampled, and multi-dimensional.

Another aspect of the technology includes reconstructing estimates of the quantized errors from the quantized, spatially-transformed errors. The reconstructing step includes decoding the quantized, spatially-transformed errors from digital to analog form and applying an inverse spatial transform to the decoded errors to produce the reconstructed, quantized error estimates. The reconstructed, quantized error estimates are combined with corresponding predictions of multiple antenna signals to produce quantized antenna signals, and the quantized antenna signals are filtered in time and space to generate predictions of multiple antenna signals. The coefficients associated with the inverse spatial transform may be received from the transmitting node.

In one example implementation, the compressed signal includes, for each antenna signal, an error signal indicating an error between the antenna signal and a prediction of the antenna signal. The decompressing includes converting the error signals from a digital format to an analog format, applying an inverse spatial linear transform to the errors to generate corresponding quantized error signals, and performing infinite impulse response filtering on the quantized error signals to generate the reconstructed representations of the multiple antenna signals. The inverse spatial linear transform may include fixed, predetermined inverse transform coefficients corresponding to an inverse discrete-cosine transform (DCT), an inverse discrete Fourier transform (DFT), or an inverse discrete wavelet transform (DWT). Alternatively, the inverse spatial linear transform may include adaptively computed inverse transform coefficients which are received from a transmitting node transmitting the compressed signal. For example, the inverse spatial linear transform coefficients correspond to an inverse Kahunen-Loeve transform (KLT).

The infinite impulse response filtering includes summing the error signals with corresponding predicted antenna signals to generate reconstructed representations of multiple antenna signals. The reconstructed multiple antenna signals are filtered using a spatial temporal prediction matrix of predictive coefficients to generate the predicted multiple antenna signals. In one non-limiting example implementation, the matrix of predictive coefficients is estimated based on empirical moving averages of (1) a cross-correlation of the multiple antenna signals and the reconstructed antenna information and (2) an auto-correlation of the reconstructed representations of the antenna signals. In another non-limiting example implementation, the matrix of predictive coefficients is estimated based on recursive empirical averages of (1) a cross-correlation of the multiple antenna signals and the reconstructed representations of the antenna signals and (2) an auto-correlation of the reconstructed representations of the antenna signals. In either case, the matrix of predictive coefficients may be received from the transmitting node.

Another aspect of the technology includes compression apparatus for compressing information in signals received at multiple antennas. Processing circuitry is configured to process the received multiple antenna signals to decorrelate the received multiple antenna signals over space and over time to generate a compressed signal. A transmitter is configured to transmit the compressed signal to a receiving node. In a non-limiting example implementation, a predictor is configured to generate predictions of the multiple antenna signals, and time decorrelation circuitry configured to determine associated error signals between the predicted multiple antenna signals and corresponding ones of the received multiple antenna signals to remove time correlation from the received multiple antenna signals and use the error signals to generate the compressed signal. Space decorrelation circuitry is configured to transform the error signals using a linear spatial transform into spatially-transformed errors to remove correlation in space between the received multiple antenna signals. A quantizer is configured to quantize each of the spatially-transformed errors. The compressed signal includes the quantized, spatially-transformed errors.

Another aspect of the technology includes decompression apparatus having a receiver configured to receive a compressed signal that corresponds to a multi-antenna signal, the multi-antenna signal including information associated with a user communication received over multiple antenna signal, a decompressor configured to decompress the compressed signal based on one or more correlation in space and in time to reconstruct a representation of the multi-antenna signal, and an output configured to provide the reconstructed representation of the multi-antenna signal for further processing or output. In a non-limiting example implementation, the compressed signal includes, for each of the antennas, an error signal indicating an error between the antenna signal and a prediction of the antenna signal. The decompression apparatus further includes an analog-to-digital converter configured to convert the error signals from a digital format to an analog format, transform circuitry configured to apply an inverse spatial linear transform to the errors to generate corresponding quantized error signals, and a filter configured to perform infinite impulse response filtering on the quantized error signals to generate reconstructed representations of the multiple antenna signals.

DETAILED DESCRIPTION

Figure 1:
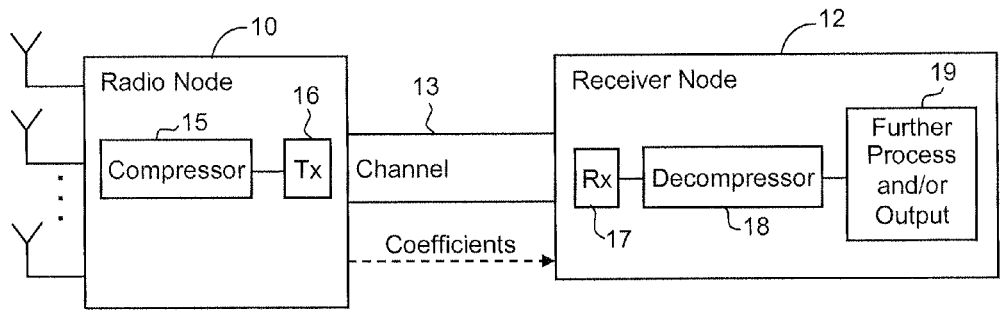
FIG. 1 illustrates a non-limiting example of a multi-antenna radio node communicating compressed multi-antenna signals with a receiver node.

In the following description, for purposes of explanation and not limitation, specific details are set forth, such as particular nodes, functional entities, techniques, protocols, standards, etc. in order to provide an understanding of the described technology. It will be apparent to one skilled in the art that other embodiments may be practiced apart from the specific details disclosed below. In other instances, detailed descriptions of well-known methods, devices, techniques, etc. are omitted so as not to obscure the description with unnecessary detail. Individual function blocks are shown in the figures. Those skilled in the art will appreciate that the functions of those blocks may be implemented using individual hardware circuits, using software programs and data in conjunction with a suitably programmed microprocessor or general purpose computer, using applications specific integrated circuitry (ASIC), and/or using one or more digital signal processors (DSPs). The software program instructions and data may be stored on computer-readable storage medium, and when the instructions are executed by a computer or other suitable processor control, the computer or processor performs the functions.

Thus, for example, it will be appreciated by those skilled in the art that diagrams herein can represent conceptual views of illustrative circuitry or other functional units. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various illustrated elements may be provided through the use of hardware such as circuit hardware and/or hardware capable of executing software in the form of coded instructions stored on computer-readable medium. Thus, such functions and illustrated functional blocks are to be understood as being either hardware-implemented and/or computer-implemented, and thus machine-implemented.

In terms of hardware implementation, the functional blocks may include or encompass, without limitation, digital signal processor (DSP) hardware, reduced instruction set processor, hardware (e.g., digital or analog) circuitry including but not limited to application specific integrated circuit(s) (ASIC) and/or field programmable gate array(s) (FPGA(s)), and (where appropriate) state machines capable of performing such functions.

In terms of computer implementation, a computer is generally understood to comprise one or more processors or one or more controllers, and the terms computer, processor, and controller may be employed interchangeably. When provided by a computer, processor, or controller, the functions may be provided by a single dedicated computer or processor or controller, by a single shared computer or processor or controller, or by a plurality of individual computers or processors or controllers, some of which may be shared or distributed. Moreover, the term "processor" or "controller" also refers to other hardware capable of performing such functions and/or executing software, such as the example hardware recited above.

The technology described in this application includes an effective, low-complexity way to represent a complex-valued radio signal either received from or to be transmitted to a multiple antenna radio node, e.g., a base station. A spatial-temporal (ST) predictor compresses the data associated with multiple antenna signals thereby reducing their dynamic range. The spatial-temporal (ST) predictor exploits the fact that radio signals received from multiple antennas are often highly correlated in both space (i.e., across antennas) and time and uses a substantially smaller number of bits to represent (quantize) a vector difference signal between the predicted and the original antenna signals while maintaining the same level of incurred quantization distortion. Upon receipt of the quantized difference signal (i.e., the compressed signal) sent over a backhaul channel by the multiple antenna radio node, a reproduction of the original multiple antenna signals may be constructed (e.g., at a receiver) by filtering the difference signal using a vector infinite impulse response (IIR) spatial-temporal filter. The filtering decompresses the received compressed signal. The coefficients associated with the spatial-temporal predictor can be predetermined or determined in real-time based on the spatial and temporal statistics of the multiple antenna radio signals. For the latter case, the predictive coefficients may be sent (preferably infrequently) over the backhaul channel along with the quantized radio signal in order to allow the multiple antenna radio signals to be reconstructed at the receiver. A low-complexity method of adaptively computing the spatial-temporal (ST) predictor based on certain correlation matrix functions of the multiple antenna radio signals is also described.

FIG. 1 illustrates a non-limiting example of a multi-antenna radio node 10 communicating compressed multi-antenna signals with a receiver node 12. The multi-antenna radio node 10 includes two or more antennas for transmitting and/or receiving antenna signals. In particular embodiments, each antenna signal is or was transmitted with the same information though transmission over the air interface distorts that information in ways that are specific to each antenna's location. Collectively, the various antenna signals form a multi-antenna signal. The multi-antenna radio node 10 includes a compressor 15 for compressing this multi-antenna signal before transmitting the compressed multi-antenna signal by a transmitter 16 over a channel 13 to the receiver node 12. The compressor 15 performs operations described below that employ coefficients that in one example embodiment are sent over the channel 13 (shown as a dotted line) to the receiver node 12. Alternatively, those coefficients may be predetermined (fixed) or are determined in the receiver node 12 so as to avoid having to send them over the channel 13. The receiver node 12 includes a receiver 17 for receiving the compressed multi-antenna signal sent over the channel and in one embodiment any transmitted coefficients. A decompressor 18 decompresses these signals using inverse operations from those used in the compressor 15. The decompressed (expanded) multi-antenna signal is then further processed and/or output as indicated in block 19. Compressing the multi-antenna signal saves considerable bandwidth on the channel 13.

Figure 2:
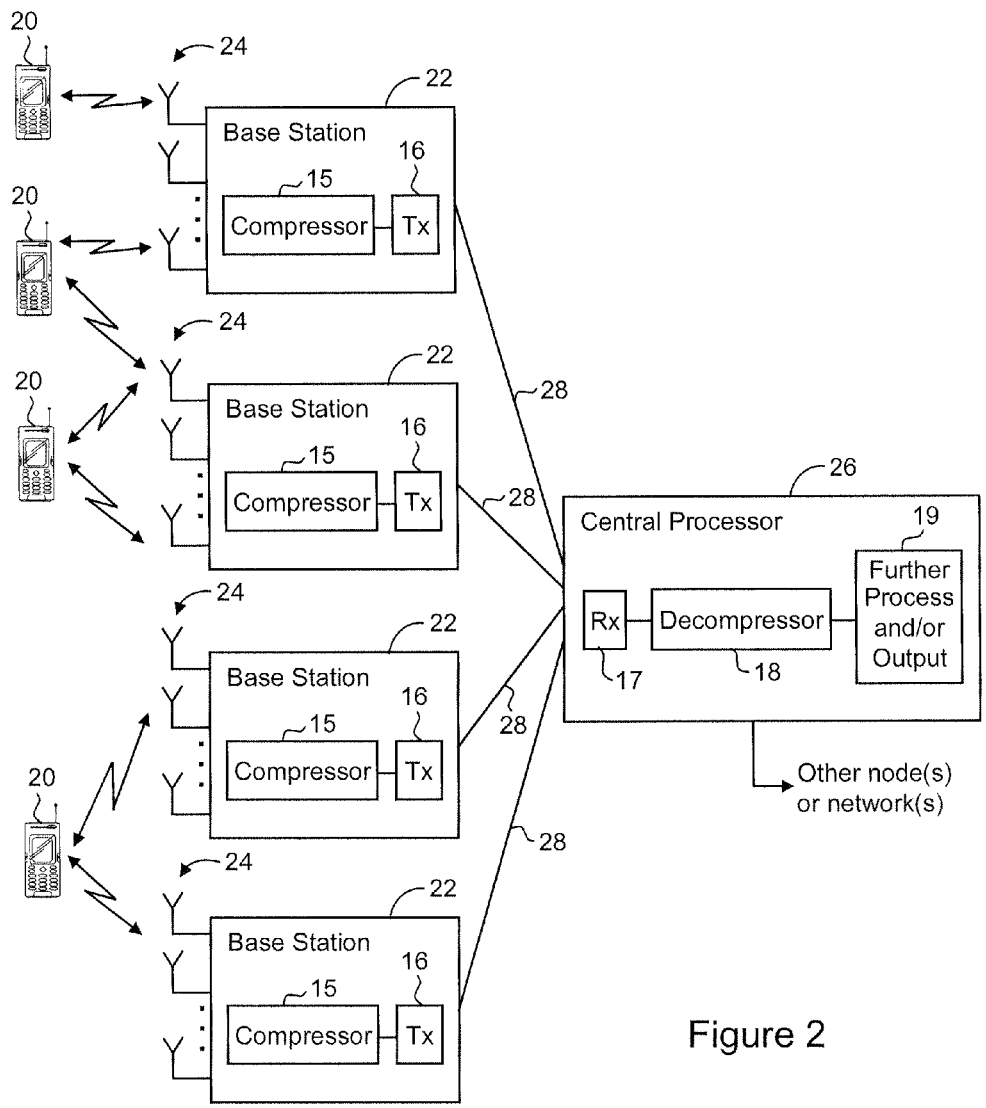
FIG. 2 illustrates a Coordinated multi-point (CoMP) communication system.

One non-limiting example application of the radio node 10 and receiver node 12 is a coordinated multi-point (CoMP) communication system, an example of which is shown in FIG. 2. Mobile radios 20 communicate over an air interface with one or more of the multiple base stations 22. Each base station 22 includes multiple antennas 24, a compressor 15, and a transmitter 16 (as described above for FIG. 1) and communicates with a central processor 26 over a backhaul link 28. The central processor 26 can be a radio network node like a radio network controller (RNC), a core network node like an MSC or an SGSN, or an independent node. The central processor 26 includes a receiver 17, a decompressor 18, and further processing and/or output 19 as described above for FIG. 1.

Figure 3:
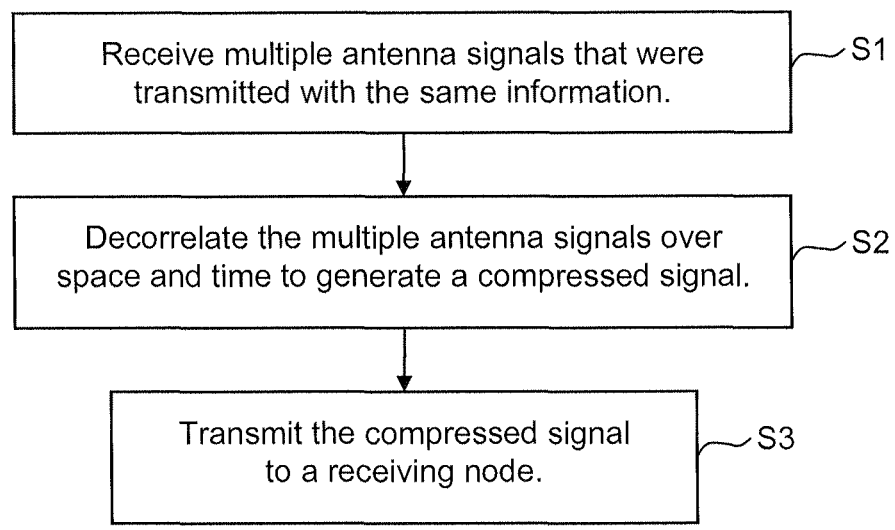
FIG. 3 is a flowchart diagram of non-limiting example compression procedures.

FIG. 3 is a flowchart diagram of non-limiting example procedures that may be used by the radio node(s) 10. The compressor 15 receives multiple antenna signals that were transmitted with the same information (step S1) and decorrelates those multiple antenna signals over space and time to remove redundancies and generate a compressed signal (step S2). In certain embodiments of radio node 10, the compressor 15 decorrelates the multiple antenna signals in time and space independently, with either occurring first. In alternative embodiments, the compressor 15 decorrelates the multiple antenna signals jointly in time and space. In general, the compressor 15 may decorrelate the multiple antenna signals with respect to time and space jointly, independently, and/or in any other appropriate manner. The transmitter 16 transmits the compressed signal to the receiving node 12 or 26 over a channel 13 or 28 (step S3).

The operations of the compressor in accordance with one example detailed embodiment are now described. First the multiple antenna signals are models as follows: Let $y[n]=[y_1[n], y_2[n], \ldots, y_{n_a}[n]]^T$ denote an $n_a$-dimensional timedomain complex-valued, sampled, multiple antenna signal vector to be communicated through a backhaul link connecting a central processor from or to a particular base station, where $n_\alpha$ denote the number of antennas at the base station and $n \in \{1, 2, \ldots, N\}$ denotes the sample time index. The temporal and spatial correlation (and thus redundancy) in the random process $\{y[n]\}$ is represented using a vector auto-regressive (VAR) model given by:

$$y[n] = \sum_{m=1}^{M} A[m]y[n-m] + e[n] \qquad (1)$$

where M is the model order, $\{e[n]\}$ is an innovation process which is modeled as a zero-mean, independent identically distributed (IID), vector Gaussian random process with $R_e[m] = Ee[n]e[n-m]^H = \Lambda_e \delta[m]$, $\delta[m]$ denotes the Kronecker-delta function, and $e[n] \equiv [e_1[n], e_2[n], \ldots, e_{n_\alpha}[n]]^T$. The VAR model can match any power spectrum of the multi-dimensional radio signal with sufficiently large order M, and it leads to simple (low-complexity) compression methods that incurs little latency, as described below. Non-limiting example values for M might be 2-8. But any suitable value for M may be used. Moreover, the VAR coefficients, as shown below, can also be computed efficiently based on measurements of the second-order statistics of the signal itself, enabling a low-complexity, adaptive implementation.

Based on the VAR model of the multi-antenna radio signal y[n] in equation (1), one approach might be to simply filter $\{y[n]\}$ with a vector FIR filter with a z-transform given by:

$$H(z) = \left(I - \sum_{m=1}^{M} A_m z^{-m}\right)$$

in order to obtain the innovation process (approximated by an error or difference) $\{e[n]\}$, which can then be quantized and sent over the backhaul link. However, since the receiver node does not have access to the original multiple antenna vector $\{y[n]\}$, as does the transmitting radio node, the encoding process is modified so as to integrate the FIR filtering with the quantization of the innovation.

Figure 4A:
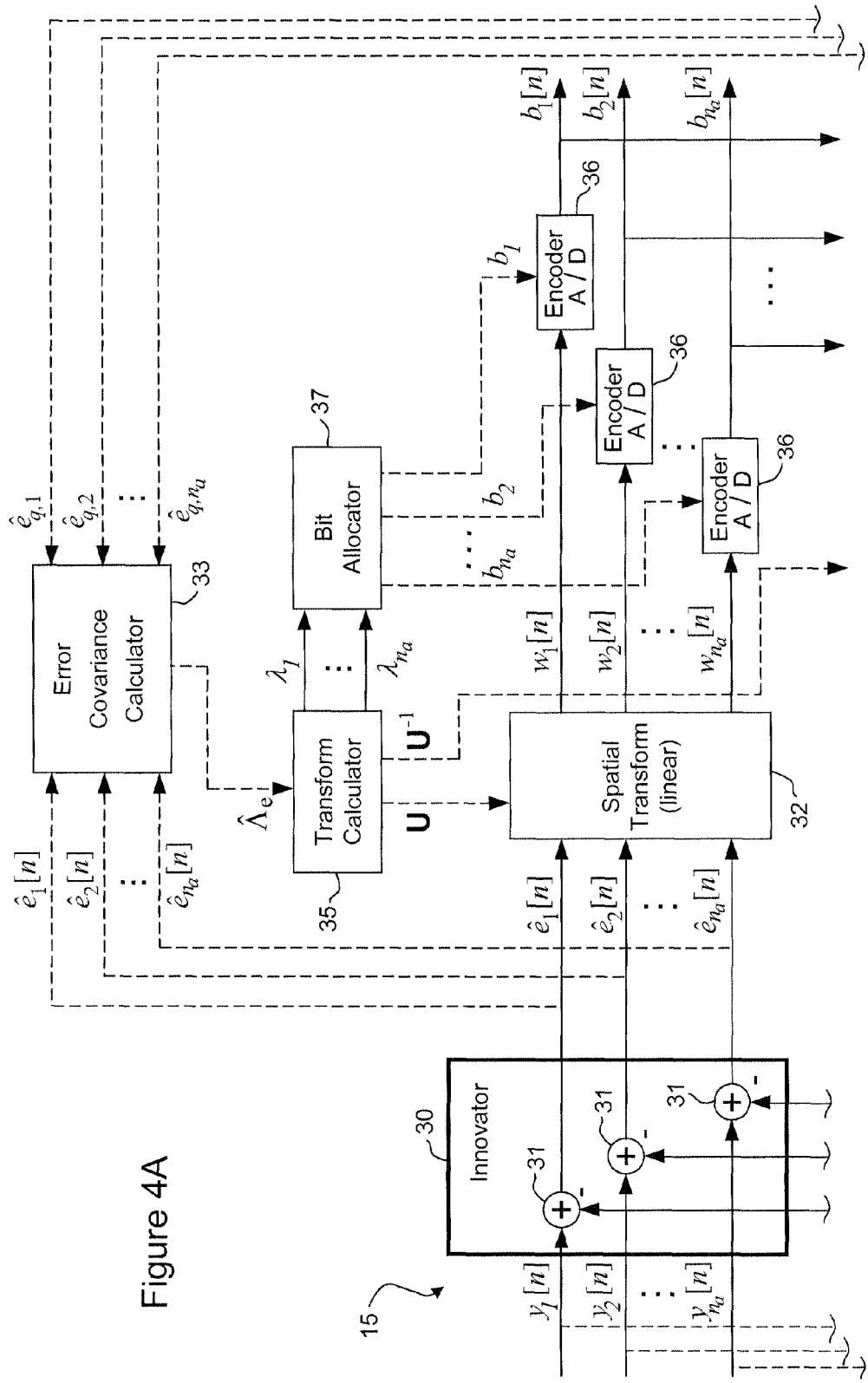
FIGS. 4A and 4B illustrate a non-limiting example diagram of multiple antenna signal compression apparatus.
Figure 4B:
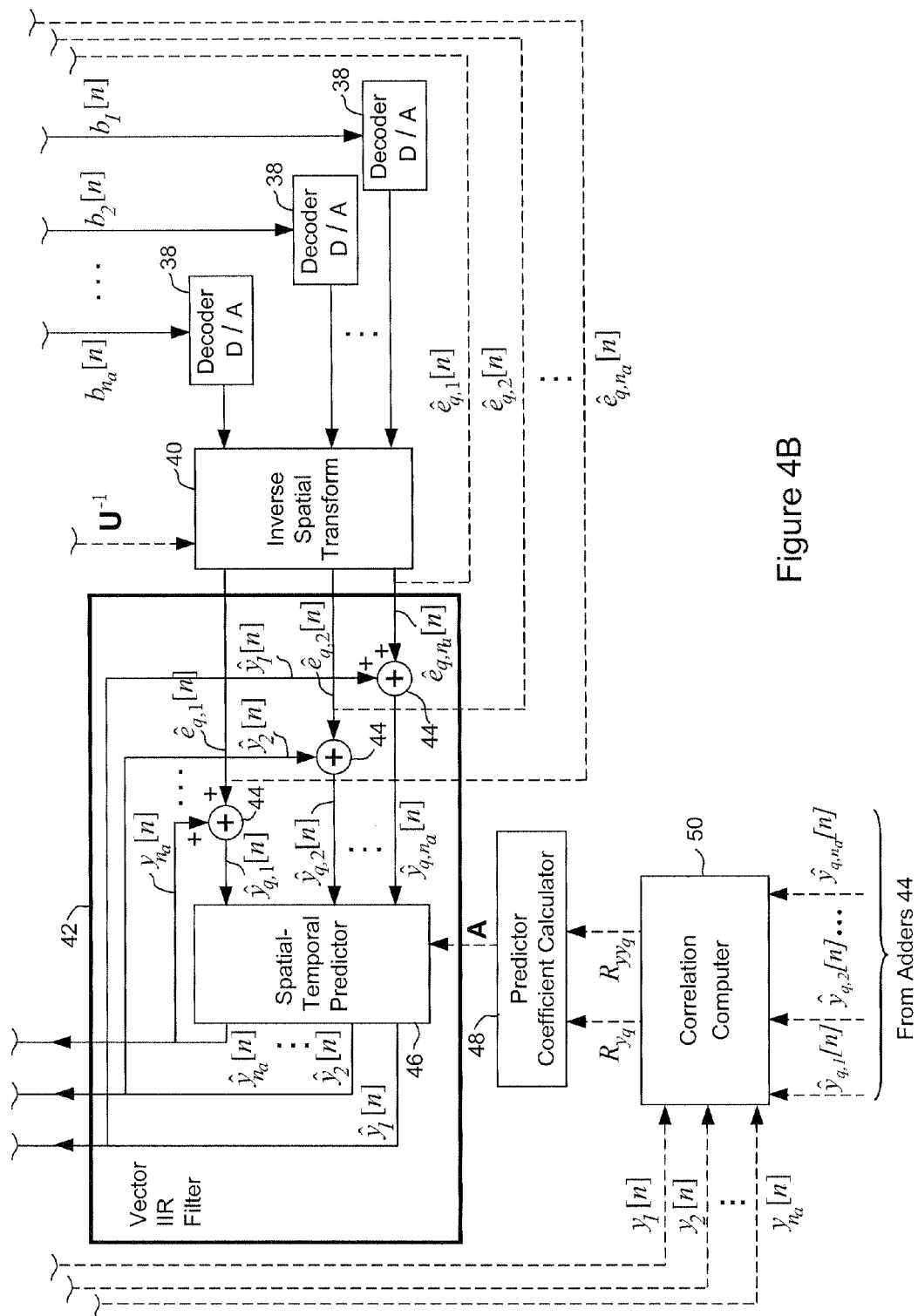

FIGS. 4A and 4B illustrate a non-limiting example diagram of multiple antenna signal compression apparatus that may be used to encode/compress $\{y[n]\}$. In general, the apparatus computes a predictive multiple antenna vector signal $\hat{y}[n]$ based on a quantized version $y_q[n]$ of the original multiple antenna vector signal y[n], which is available at both the transmitting and the receiving ends, as $$\hat{y}[n] = \sum_{m=1}^{M} A_m y_q[n-m].$$

Since vector y[n] is often correlated in time, the error vector signal $\hat{e}[n] \equiv y[n] - \hat{y}[n]$, which serves as an estimate of the true innovation e[n], should have much smaller dynamic range than y[n] and can thus be quantized with fewer number of bits to achieve the same level of quantization distortion. The quantized vector signal $y_q[n]$ is simply given by the sum of the predictive vector signal $\hat{y}[n]$ and the quantized version $\hat{e}_q[n]$ of vector $\hat{e}[n]$. Since $$y[n] - y_q[n] = y[n] - \hat{y}[n] - \hat{e}_q[n] = \hat{e}[n] - \hat{e}_q[n],$$

the fidelity of vector $\hat{e}_q[n]$ in representing vector $\hat{e}[n]$ translates directly into the fidelity of vector $y_q[n]$ in representing the received, multiple antenna signals vector y[n]. The innovator 30 in FIG. 4A includes $n_\alpha$ combiners 31 for determining a difference $\hat{e}[n]$ provided to a linear spatial transform 32 and an error covariance calculator 33.

The predictive vector signal $\hat{y}[n]$ is provided by block 42 shown in FIG. 4B, which in effect applies a vector infinite impulse response (IIR) filter 42 to the quantized error vector signal $\hat{e}_q[n]$. More specifically, block 42 generates the predictive vector signal $\hat{y}[n]$ for the next time instance by applying a vector finite-impulse-response (FIR) filter functioning as a spatial-temporal predictor 46 to the sum of the predictive vector signal $\hat{y}[n]$ and the quantized error vector signal $\hat{e}_q[n]$ from the previous time instances generated by the adder 44. The quantized error vector signal $\hat{e}_q[n]$ is generated by applying an inverse spatial transform 40 shown in FIG. 4B to the output of the decoders 38. The decoders 38 map the bits produced by the analog-to-digital (A/D) encoders 36, e.g., through table lookups, to a reconstructed or quantized version of the transformed error signal, which is then transformed to the quantized error vector signal $\hat{e}_q[n]$ through the inverse spatial transform 40.

To minimize the dynamic range of the error vector signal $\hat{e}[n]$, the predictive matrix coefficients $A \equiv [A_1, A_2, \ldots, A_M]$ generated by a predictor coefficient calculator 48 shown in FIG. 4B may be computed by minimizing the variance of $\hat{e}[n]$:

$$A = \underset{A=[A_1,\ldots,A_M]}{\operatorname{argmin}} E\|\hat{e}[n]\|^2 = \underset{A=[A_1,\ldots,A_M]}{\operatorname{argmin}} E\left\|y[n] - \sum_{m=1}^{M} A_m y_q[n]\right\|^2.$$

The orthogonality principle provides:

$$E\left(y[n] - \sum_{m=1}^{M} A_m y_q[n-m]\right) y_q[n-k]^H = 0$$

for all k=1, 2, . . . , M. In matrix form, this becomes:

$$A \begin{bmatrix} R_{y_q}[0] & R_{y_q}[-1] & \cdots & R_{y_q}[M-1] \\ R_{y_q}[1] & R_{y_q}[0] & \ddots & \vdots \\ \vdots & \ddots & R_{y_q}[0] & R_{y_q}[-1] \\ R_{y_q}[M-1] & \cdots & R_{y_q}[1] & R_{y_q}[0] \end{bmatrix} = \qquad (2)$$

$$[R_{yy_q}[1] R_{yy_q}[2] \ldots R_{yy_q}[M]]$$

where $R_{yy_q}[m] \equiv Ey[n]y_q[n-m]^H$ and $R_{y_q}[m] \equiv Ey_q[n]y_q[n-m]^H$ are the multidimensional cross-correlation function of y[n] and $y_q[n]$ and auto-correlation function of $y_q[n]$, respectively. Equation (2) can be efficiently solved by a modified version of the Whittle-Wiggins-Robinson (WWR) algorithm which computes A in an order-recursive fashion, as summarized below. (The WWR algorithm solves equation (2) when its right-hand side is $[R_{y_q}[1] R_{y_q}[2] \ldots R_{y_q}[M]]$ instead.)

Let $A^{(m)} \equiv [A_1^{(m)}, A_2^{(m)}, \ldots, A_m^{(m)}]$ denote the solution of equation (2) when M=m. In other words, $A = A^{(M)}$. The following algorithm solves equation (2) by recursively computing $A^{(m)}$ until m reaches the desired order M. For notational simplicity, let $R_{y_q}[1:m] \equiv [R_{y_q}[1], R_{y_q}[2], \ldots, R_{y_q}[M]]$ and $R_{yy_q}[1:m] \equiv [R_{yy_q}[1], R_{yy_q}[2], \ldots, R_{yy_q}[M]]$.

Step 1: Initialization (set m=1)

$A_1^{(1)} = R_{yy_q}[1] R_{y_q}[0]^{-1}$,
$\bar{A}_1^{(1)} = R_{y_q}[1] R_{y_q}[0]^{-1}$, $\bar{B}_1^{(1)} = R_{y_q}[-1]^H R_{y_q}[0]^{-1}$,
$Q_1 = R_{y_q}[0] - \bar{A}_1^{(1)} R_{y_q}[1]^H$ and $S_1 = R_{y_q}[0] - \bar{B}_1^{(1)} R_{y_q}[1]$.

Step 2: Recursively compute the following quantities (until m reaches M)

$$\overline{P}_m = R_{y_q}[m+1] - \sum_{i=1}^{m} \overline{A}_i^{(m)} R_{y_q}[m+1-i]$$

$$\overline{A}_i^{(m+1)} = \overline{A}_i^{(m)} - \overline{P}_m S_m^{-1} \overline{B}_{m-i+1}^{(m)} \quad \text{for } i = 1, 2, \ldots, m$$

$$\overline{A}_{m+1}^{(m+1)} = \overline{P}_m S_m^{-1}$$

$$\overline{B}_{m-i+1}^{(m+1)} = \overline{B}_{m-i+1}^{(m)} - \overline{P}_m^H Q_m^{-1} \overline{A}_i^{(m)} \quad \text{for } i = 1, 2, \ldots, m$$

$$\overline{B}_{m+1}^{(m+1)} = \overline{P}_m^H Q_m^{-1}$$

$$Q_{m+1} = Q_m - \overline{P}_m S_m^{-1} \overline{P}_m^H \text{ and } S_{m+1} = S_m - \overline{P}_m^H Q_m^{-1} \overline{P}_m$$

$$P_m = R_{yy_q}[m+1] - \sum_{i=1}^{m} A_i^{(m)} R_{yy_q}[m+1-i]$$

$$A_{m+1}^{(m+1)} = P_m \left( R_{y_q}[0] - \sum_{i=1}^{m} \overline{A}_i^{(m)} R_{y_q}[i]^H \right)^{-1}$$

$$A_i^{(m+1)} = A_i^{(m)} - \tilde{A}_{m+1}^{(m+1)} \overline{A}_{m+1-i}^{(m)} \quad \text{for } i = 1, 2, \ldots, m$$

Step 3: Finally, set $A = A^{(M)}$.

(Note that $\{\overline{A}_i^{(m)}\}_{i=1}^{m}$ and $\{\overline{B}_i^{(m)}\}_{i=1}^{m}$ are auxiliary variables representing, respectively, the forward and backward matrix prediction coefficients satisfying similar (Yule-Walker) equations as (2) except that its right-hand side becomes $[R_{y_q}[1], \ldots, R_{y_q}[m]]$ instead of $[R_{yy_q}[1], \ldots, R_{yy_q}[m]]$.)

$R_{yy_q}[m]$ and $R_{y_q}[m]$ may be approximated by empirical moving averages $\hat{R}_{yy_q}[n,m,N_w]$ and $\hat{R}_{y_q}[n,m,N_w]$, respectively, which are given by:

$$\hat{R}_{yy_q}[n, m, N_w] \equiv \frac{1}{N_w} \sum_{k=n-N_w+1}^{n} y[k] y_q^H[k-m]$$

$$= \frac{1}{N_w} \begin{bmatrix} N_w \hat{R}_{yy_q}[n-1, m, N_w] + y[n] y_q^H[n-m] - \\ y[n-N_w] y_q^H[n-N_w-m] \end{bmatrix}$$

$$\hat{R}_{y_q}[n, m, N_w] \equiv \frac{1}{N_w} \sum_{k=n-N_w+1}^{n} y_q[k] y_q^H[k-m]$$

$$= \frac{1}{N_w} \begin{bmatrix} N_w \hat{R}_{y_q}[n-1, m, N_w] + y_q[n] y_q^H[n-m] - \\ y_q[n-N_w] y_q^H[n-N_w-m] \end{bmatrix}.$$

for a correlation lag m=0, 1, ..., M−1, where n denotes the current time index, and N denotes the window size. These moving averages can be updated immediately as the latest sample y[n] and $y_q[n]$ become available at the encoding end (the radio node 10). Alternatively, $R_{yy_q}[m]$ and $R_{y_q}[m]$ may be approximated by recursive empirical averages $\hat{R}_{yy_q}[n,m;\alpha]$ and $\hat{R}_{y_q}[n,m;\alpha]$, which are given by:

$$\hat{R}_{yy_q}[n,m;\alpha] \equiv (1-\alpha)\hat{R}_{yy_q}[n-1,m;\alpha] + \alpha y[n] y_q^H[n-m]$$

and $$\hat{R}_{y_q}[n,m;\alpha] \equiv (1-\alpha)\hat{R}_{y_q}[n-1,m;\alpha] + \alpha y[n] y_q^H[n-m]$$

where $\alpha \in (0,1)$ denotes a certain predefined forgetting factor, and $\hat{R}_{yy}[0,m;\alpha]$ and $\hat{R}_{y_q}[0,m;\alpha]$ are initialized to the all-zero matrix for all m. The vectors $R_{yy_q}[m]$ and $R_{y_q}[m]$ are calculated in a correlation computer 50 using y[n] and $y_q[n]$, as shown in FIG. 4B, and are provided to the predictor coefficient calculator 48 which uses them to generate the coefficient matrix A.

To reduce the frequency of sending overhead for the VAR coefficients A, the compressor may use these empirical averages to compute A only after each block of T samples. For example, all signal samples between time [kT,(k+1)T−1] will assume the same set of VAR coefficients A computed at time kT based on $\hat{R}_{yy_q}[kT,m;\alpha]$ and $\hat{R}_{y_q}[kT,m;\alpha]$, or alternatively $\hat{R}_{yy_q}[kT,m;\alpha]$ and $\hat{R}_{y_q}[kT,m;\alpha]$, for any period index k.

Similar to the actual innovation e[n] at each time n, its estimate ê[n] is also spatially-correlated (across the multiple antennas), and therefore, direct independent quantization of each component $\hat{e}_i[n]$, for i=1, 2, ..., $n_\alpha$, of $\hat{e}[n] \equiv [\hat{e}_1[n], \hat{e}_2[n], \ldots, \hat{e}_{n_\alpha}[n]]^T$, although possible, is not an efficient way of quantizing ê[n]. To exploit the spatial correlation, a linear spatial transformation is performed in block 32 on the error signal ê[n] using transform coefficients U from transform calculator 35 so that the transformed error vector signal w[n] $\equiv [w_1[n], w_2[n], \ldots, w_{n_\alpha}[n]]^T$ has most of its energy (at a lower amplitude) concentrated in a smaller number $K_\alpha$ of matrix elements representing the error, where $K_\alpha \leq n_\alpha$, and thus the rest of its element can be discarded without affecting the fidelity of the reproduced signal.

The linear transformation 32 may be fixed and pre-computed as, for example, the discrete-cosine transform (DCT), the Discrete Fourier Transform (DFT) or a discrete wavelet transform (DWT). In this case, there is no need to send the transform coefficients U along with the quantized prediction error $e_q[n]$ to the receiving node 12.

Alternatively, the transformation 32 can be computed using adaptively computed matrix coefficients, e.g., using the Kahunen-Loeve Transform (KLT) for the prediction error process $\{\hat{e}[n]\}$ through eigen-decomposition of its marginal covariance matrix $\Lambda_{\hat{e}} = E\hat{e}[n]\hat{e}^H[n]$, which is given by $\Lambda_{\hat{e}} = UDU^H$, where U is a unitary matrix with columns being the eigenvectors of $\Lambda_{\hat{e}}$, and D is a diagonal matrix with diagonal elements $\{\lambda_{\hat{e},i}\}_{i=1}^{N_\alpha}$ being the eigenvalues of $\Lambda_{\hat{e}}$. The KLT transformation matrix is simply given by U. If adaptively computed matrix coefficients are used, then the transform calculator 35 may also compute the matrix coefficients of the inverse transform and send them to the receiving node. If a KLT transformation matrix U is used, then the inverse transform matrix coefficients are given by the Hermitian, or the conjugate transpose, denoted by $U^H$, of the matrix U.

The eigenvalues $\{\lambda_{\hat{e},i}\}_{i=1}^{N_\alpha}$ of $\Lambda_{\hat{e}}$ represent the corresponding variances of the transformed predicted errors, which can be used by the compressor to decide which errors, if any, should be discarded. Alternatively, it may be preferred to allocate different number of bits $b_i$ to each transformed error output w[n] according to its significance as indicated by its variance. If the variance of a component is too small relative to those of the other components, no bits may be allocated to quantize it, i.e., it is discarded.

FIG. 4A shows quantizers 36 (labeled as A/D encoders) which uses the allocated number of bits $b_i$ to quantize their respective inputs w[n] based on information provided by bit allocator 37. The bit allocator 37 determines those allocations using the eigenvalues $\{\lambda_{\hat{e},i}\}_{i=1}^{N_\alpha}$ of the error covariance matrix $\Lambda_{\hat{e}}$ calculated by transform computer 35 from the error covariance matrix $\Lambda_{\hat{e}}$. There are different methods to determine $\{b_i\}_{i=1}^{N_\alpha}$ depending on the type of quantizer used. For fixed-rate quantization, one can compute $\{b_i\}_{i=1}^{N_\alpha}$ using a high-resolution approximation as, e.g., $$b_i \cong \frac{b_{total}}{n_\alpha} + \frac{1}{2} \log \left( \lambda_{e,i} \Big/ \left( \prod_{j=1}^{n_\alpha} \lambda_{e,j} \right)^{1/n_\alpha} \right)$$

where $b_{total}$ denotes the total number of bits available to quantize each sample of w[n]. Alternatively, one can also allocate equal number of bits to the first k components, where $\sigma_k^2 > \beta$ and $k \le n_\alpha$. In this case, $\beta$ is the minimum energy that determines if an error in the vector w[n] from spatial transform 32 should be neglected. After calculating b[n], the compression apparatus transmits b[n] to receiving node 12 as a compressed multi-antenna signal. Although not shown in FIG. 4A, for the sake of simplicity, the compression apparatus may perform a parallel-to-serial conversion on b[n] or otherwise process b[n] in a suitable manner before transmitting the compressed multi-antenna signal to receiving node 12.

Alternatively, one can apply the Breiman, Friedman, Olshen, and Store (BFOS) algorithm to optimally allocate the bits for a given set of component codebooks $\{C_i\}$. See Riskin et al., "Optimal bit allocation via the generalized BFOS algorithm," IEEE Trans. Info. Thy., vol. 37, pp. 400-402, March 1991, incorporated herein by reference. This quantizer for each coefficient described by Riskin et al. is a fixed-rate quantizer, i.e., it generates a fixed total number of bits $b_{total}$ at each time instance. But the quantizer for each coefficient can also be a variable-rate quantizer. In this example, it is preferred to use a quantizer with a uniform step or cell size in combination with an entropy encoder, such as a Huffman encoder, a Ziv-Lempel encoder, or an arithmetic encoder, which are well known to those skilled in the art, to generate a variable total number of bits at each time instance. See for example chapter 9 in Gersho and Gray, *Vector Quantization and Signal Compression*, Kluwer Academic Publishers, 1992. The fidelity of the reproduced signal is controlled by the choice of the step or cell size instead of the choice of the total number of bits $b_{total}$.

The eigenvalues $\{\lambda_{\hat{e},i}\}_{i=1}^{N_\alpha}$ may also be needed to scale each error in vector w[n] and to scale the reconstructed components at the decoding end if standard (Gaussian) quantization codebooks designed for probability distributions with unit variance are used.

The marginal covariance matrix $\Lambda_{\hat{e}}$ can be approximated in the error covariance calculator 33 by an empirical moving average computed over a window of time samples as:

$$\Lambda_{\hat{e}} \approx \hat{\Lambda}_{\hat{e}}[n, N_w] \equiv \frac{1}{N_w} \sum_{i=n-N_w+1}^{n} \hat{e}[i]\hat{e}^H[i]$$

$$= \frac{1}{N_w} \sum_{i=n-N_w+1}^{n} (y[i] - \hat{y}[i])([i] - \hat{y}[i])^H$$

$$= \frac{1}{N_w} \begin{bmatrix} (N_w - 1)\hat{\Lambda}_{\hat{e}}[n-1; N_w-1] + \\ (y[n] - \hat{y}[n])(y[n] - \hat{y}[n])^H - \\ (y[N_w] - \hat{y}[N_w])(y[N_w] - \hat{y}[N_w])^H \end{bmatrix}$$

where $N_w$ denotes the number of time samples within the window, or alternatively, by a recursive empirical average computed as:

$$\Lambda_{\hat{e}} \approx \hat{\Lambda}_{\hat{e}}[n;\alpha] = \hat{\Lambda}_{\hat{e}}[n-1;\alpha] + (y[n]-\hat{y}[n])(y[n]-\hat{y}[n])^H - (y[n-1]-\hat{y}[n-1])(y[n-1]-\hat{y}[n-1])^H$$

where $\alpha \in (0,1)$ denotes a certain predefined forgetting factor, and $\hat{\Lambda}_{\hat{e}}[0;\alpha]$ is initialized to the all-zero matrix. To minimize the frequency of sending U, thereby saving bandwidth on the backhaul, $\{\lambda_{\hat{e},i}\}_{i=1}^{K_\alpha}$, and $\{b_i\}_{i=1}^{K_\alpha}$ (where $K_\alpha$ is the number of errors in w[n] with non-zero number bits allocated), the transform calculator 35 may use these empirical averages to compute (U, $\{\lambda_{\hat{e},i}\}_{i=1}^{N_\alpha\bullet}$, $\{b_i\}_{i=1}^{N_\alpha}$) only after each block of T samples. For example, all signal samples between time [kT, (k+1)T-1] may assume the same spatial transform U and eigenvalues $\{\lambda_{\hat{e},i}\}_{i=1}^{N_\alpha}$ computed at time kT based on $\hat{\Lambda}_{\hat{e}}[n, N_w]$ or alternatively $\hat{\Lambda}_{\hat{e}}[n;\alpha]$, for any period index k.

Figure 5:
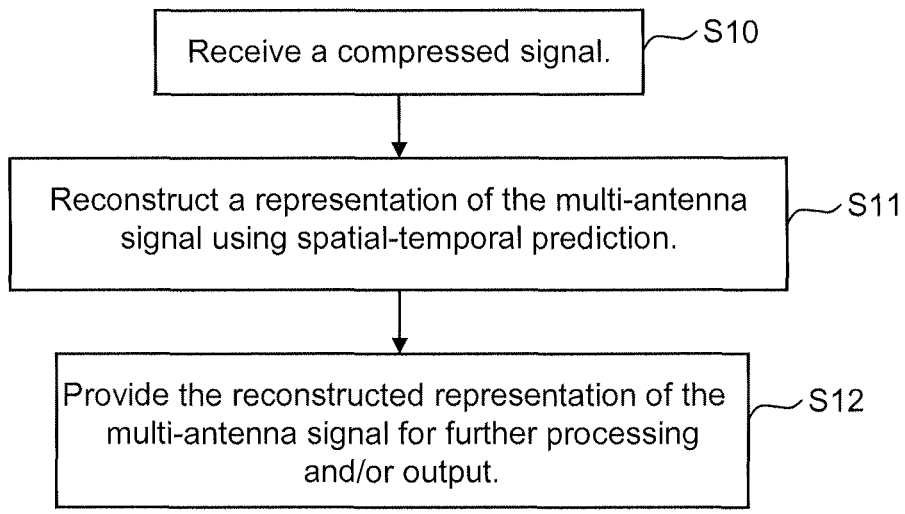
FIG. 5 is a flowchart diagram of non-limiting example decompression procedures.

The receiving node 12 performs a decompression method to recover representations of the multiple antenna signals. FIG. 5 is a flowchart diagram of non-limiting example decompression procedures. First, a compressed signal that corresponds to a multi-antenna signal is received (step S10). Next, the received signal is decompressed based on one or more correlations in space and in time to reconstruct a representation of the multi-antenna signal (step S11). The correlation in space and time may represent a correlation of multiple antenna signals in space and in time performed independently and in any order, or the correlation may represent a joint correlation of the multiple antenna signals in space and time. In general, receiving node 12 may utilize any appropriate form of correlation with respect to time and space, including any suitable joint or independent correlation of the two values. The reconstructed representation of the multi-antenna signal is then provided for further processing or output (step S12).

Figure 6:
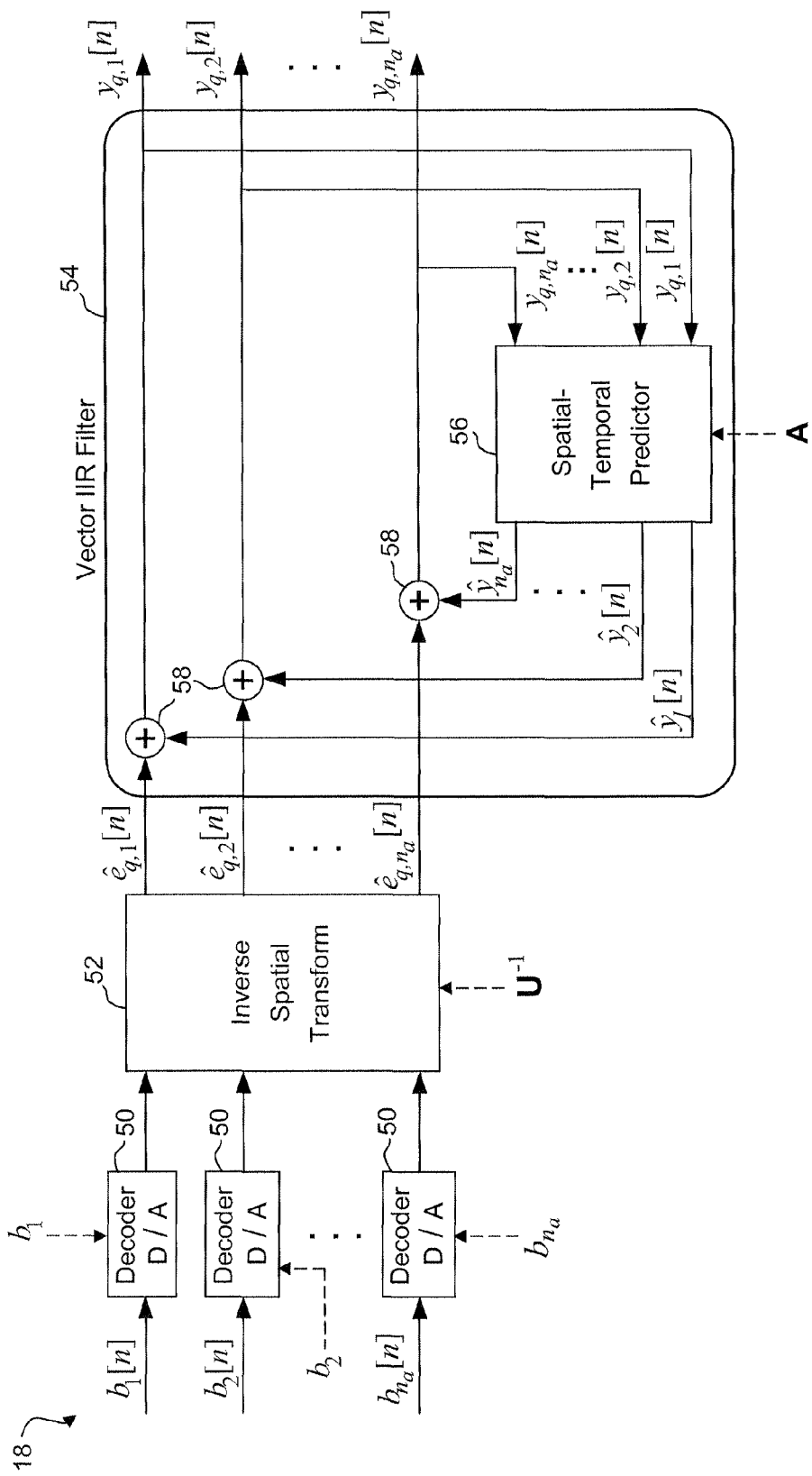
FIG. 6 illustrates a non-limiting example diagram of multiple antenna signal decompression apparatus.

FIG. 6 illustrates a non-limiting example diagram of multiple antenna signal decompression apparatus using to generate a reconstruction vector $\{y_q[n]\}$ of the multiple antenna signal vector y[n]. The receiver 18 receives the compressed multi-antenna signal b[n] at respective decoders 50 which generate corresponding analog signals based on respective bit allocations $b_1, b_2, b_{n_\alpha}$ that are either predetermined or adaptively selected. If they are adaptive selected, those bit allocations may be received from radio station over the channel. An inverse spatial transform 52 performs the inverse spatial transform using inverse coefficient matrix $U^{-1}$ generated by transform calculator 35 and sent to the receiving node 12 over the channel or generated at the receiving node. The inverse spatial transform generates the quantized version $\hat{e}_q[n]$ of the error signal $\hat{e}[n]$ which is input to a vector IIR filter 54 which combines it in respective combiners 58 with corresponding predictive vector signals $\hat{y}[n]$ generated by a spatial-temporal predictor 56 using coefficient matrix A operating on reconstruction vector $\{y_q[n]\}$ of the multiple antenna signal vector y[n]. This is equivalent to filtering $\hat{e}_q[n]$ by vector IIR filter 54 with a matrix z-transform H(z) given by generated by the predictor coefficient calculator 48 in the radio node and sent to the receiving node 12 over the channel or generated at the receiving node 12.

$$H(z) = \left(I - \sum_{m=1}^{M} A_m z^{-m}\right)^{-1}.$$

The output of the vector IIR filter 54 is the reconstruction vector $\{y_q[n]\}$ that represents the multi-antenna signal now decompressed.

Since the VAR coefficients A computed by the predictor coefficient calculator 48 are minimum-phase (in the sense that the roots of the determinant of the matrix $$\left(I - \sum_{m=1}^{M} A_m z^{-m}\right)$$

are all inside the unit circle), the IIR filter response is stable.

In an example embodiment, the matrix predictive coefficients A are diagonal matrices, which means that in effect, the spatial temporal predictors 46 and 56 do not exploit the spatial correlation but only the temporal correlation of the received compressed multi-antenna signal. The spatial correlation is exploited only through transform coding on the prediction errors. This embodiment reduces the amount of overhead needed to describe the predictive coefficients A (which are scalars) at the expense of some performance degradation. These scalar predictive coefficients can also be further restricted to be identical across different antennas, in which case, the measurement of second-order statistics may be averaged across antennas as well. The modified WWRA algorithm reduces to the Levinson-Durbin algorithm in this case.

While the model order M of the predictor is assumed to be fixed and predetermined, if desired, the adaptive selection of M may be integrated in the order-recursive computation of the predictive coefficients by incrementing the model order only when the resulting reduction in the prediction error variance is sufficiently substantial. In this case, the adaptively selected model order M may be sent to the receiving node.

If the underlying frame structure and timing of the backhaul signaling is known, performance may be improved by using different (smaller) model orders at the start of each frame to avoid mixing potentially different statistics of adjacent frames.

There are multiple advantages provided by this technology including, for example, providing an effective way to compress complex-valued radio signals either received from or to be transmitted to a remote base station with one or more antennas. Both spatial and temporal correlations in the multi-dimensional radio signals are exploited through joint spatial-temporal linear prediction to significantly reduce the amount of data that must be transmitted over the backhaul to communicate the ultimate information to be delivered. This means the capacity of the backhaul is significantly increased. Moreover, the technology is universal and has relatively low implementation complexity. There is no need to assume any particular time or frequency structure in the radio signal, and hence, is applicable for example to all 2G, 3G, and 4G standardized signals. The technology provides for continuous operation with little additional latency to the radio signal. Moreover, using linear prediction to compress analog signals in multiple dimensions (e.g., compressing a multi-antenna radio signal) provides an excellent tradeoff in performance and complexity. Accordingly, the technology may become important in backhaul-signal codecs in the future.

Although various embodiments have been shown and described in detail, the claims are not limited to any particular embodiment or example. None of the above description should be read as implying that any particular element, step, range, or function is essential such that it must be included in the claims scope. The scope of patented subject matter is defined only by the claims. The extent of legal protection is defined by the words recited in the allowed claims and their equivalents. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the technology described, for it to be encompassed by the present claims. No claim is intended to invoke paragraph 6 of 35 USC §112 unless the words "means for" or "step for" are used. Furthermore, no embodiment, feature, component, or step in this specification is intended to be dedicated to the public regardless of whether the embodiment, feature, component, or step is recited in the claims.

The invention claimed is:

1. A compression method for compressing information in radio signals received at multiple radio antennas, comprising the steps of:
   receiving, over a plurality of radio antennas, multiple radio antenna signals associated with a user communication;
   decorrelating the received radio antenna signals over space and over time to generate a compressed signal, and transmitting the compressed signal to a receiving node,
   wherein the multiple radio antenna signals are complex-valued.

2. The compression method in claim 1, wherein decorrelating the received radio antenna signals over space and over time comprises decorrelating the received antenna signals over space and time independently.

3. The compression method in claim 1, wherein decorrelating the received radio antenna signals over space and over time comprises jointly decorrelating the received radio antenna signals over space and time.

4. The compression method in claim 1, wherein the multiple radio antenna signals are part of a coordinated multi-point communication, and wherein the transmitting is over one or more backhaul communications links.

5. The compression method in claim 1, wherein the decorrelating includes:
   generating predictions of the multiple radio antenna signals;
   determining associated error signals between the predicted multiple radio antenna signals and corresponding ones of the received multiple radio antenna signals; and
   using the error signals to generate the compressed signal.

6. The compression method in claim 5, further comprising:
   transforming the error signals using a linear spatial transform into spatially-transformed errors, and
   quantizing each of the spatially-transformed errors,
   wherein the compressed signal includes the quantized, spatially-transformed errors.

7. The compression method in claim 6, wherein the spatial linear transform includes fixed, predetermined transform coefficients corresponding to a discrete-cosine transform (DCT), a discrete Fourier transform (DFT), or a discrete wavelet transform (DWT).

8. The compression method in claim 6, wherein the spatial linear transform includes adaptively computed transform coefficients, and wherein the method further comprises transmitting the adaptively computed transform coefficients to the receiving node.

9. The compression method in claim 6, wherein the spatial linear transform includes transform coefficients corresponding to a Kahunen-Loeve transform (KLT).

10. The compression method in claim 6, further comprising quantizing the spatially-transformed errors using a predetermined fixed number of bits.

11. The compression method in claim 6, wherein one of more of the spatially-transformed errors is not quantized.

12. The compression method in claim 6, further comprising:
   quantizing spatially-transformed errors using an adaptively selected number of bits that depends on corresponding variances of the spatially-transformed errors over time;
   allocating a larger number of bits for quantizing a spatially-transformed error with a larger corresponding variance; and
   allocating a smaller number of bits for quantizing a spatially-transformed error with a smaller corresponding variance.

13. The compression method in claim 12, further comprising allocating bits according to a logarithm of the variances of the spatially transformed errors for quantizing the spatially-transformed errors.

14. The compression method in claim 12, further comprising using a BFOS algorithm to allocate bits for quantizing the spatially-transformed errors.

15. The compression method in claim 6, further comprising quantizing the spatially-transformed errors using variable-rate quantizers.

16. The compression method in claim 6, further comprising:
   quantizing spatially-transformed errors using quantizers with uniform step or cell sizes; and
   encoding the output of said quantizers with uniform step or cell sizes using entropy encoders.

17. The compression method in claim 9, further comprising
calculating an error covariance matrix for the spatially-transformed errors using an empirical moving average computed over a window of time samples of the error signals;
computing the eigen-decomposition of the said error covariance matrix; and
using the resulting eigen-vectors from the eigen-decomposition to form a KLT coefficient matrix.

18. The compression method in claim 17, further comprising transmitting the KLT coefficient matrix to the receiving node.

19. The compression method in claim 6, further comprising:
quantizing the spatially-transformed errors using an adaptively selected number of bits allocated to spatially-transformed errors, and
transmitting the bit allocations for the spatially-transformed errors to the receiving node.

20. The compression method in claim 5, wherein the generating step includes finite impulse response (FIR) filtering.

21. The compression method in claim 6, wherein the generating step includes:
reconstructing estimates of the quantized errors from the quantized, spatially-transformed errors;
combining the reconstructed, quantized error estimates with corresponding predictions of multiple radio antenna signals to produce quantized antenna signals;
filtering the quantized antenna signals in time and space to generate the predictions of multiple antenna signals.

22. The compression method in claim 21, wherein the reconstructing step includes:
decoding the quantized, spatially-transformed errors, and
applying an inverse spatial transform to the decoded errors to produce the reconstructed, quantized error estimates.

23. The compression method in claim 22, further comprising transmitting coefficients associated with the inverse spatial transform to the receiving node.

24. The compression method in claim 21, wherein the filtering step includes:
filtering the quantized antenna signals using a matrix of predictive coefficients.

25. The compression method in claim 24, further comprising:
estimating the matrix of predictive coefficients using empirical moving averages of (1) a cross-correlation of the multiple antenna signals and the quantized antenna signals and (2) an auto-correlation of the quantized antenna signals.

26. The compression method in claim 24, further comprising:
estimating the matrix of predictive coefficients using recursive empirical averages of (1) a cross-correlation of the multiple antenna signals and the quantized antenna signals and (2) an auto-correlation of the quantized antenna signals.

27. The compression method in claim 26, further comprising transmitting the matrix of predictive coefficients to the receiving node.

28. The compression method in claim 27, further comprising transmitting the matrix of predictive coefficients to the receiving node.

29. Compression apparatus for compressing information in radio signals received at multiple radio antennas, comprising:
processing circuitry configured to process the received multiple radio antenna signals to decorrelate the received multiple radio antenna signals over space and over time to generate a compressed signal, and
a transmitter configured to transmit the compressed signal to a receiving node,
wherein the multiple radio antenna signals are complex-valued.

30. The compression apparatus in claim 29, further comprising:
a predictor configured to generate predictions of the multiple radio antenna signals;
time decorrelation circuitry configured to determine associated error signals between the predicted multiple radio antenna signals and corresponding ones of the received multiple radio antenna signals to remove time correlation from the received multiple radio antenna signals and use the error signals to generate the compressed signal;
space decorrelation circuitry configured to transform the error signals using a linear spatial transform into spatially-transformed errors to remove correlation in space between the received multiple radio antenna signals; and
a quantizer configured to quantize each of the spatially-transformed errors,
wherein the compressed signal includes the quantized, spatially-transformed errors.

31. The compression apparatus in claim 29, wherein the processing circuitry is configured to decorrelate the received antenna signals over space and time independently.

32. The compression apparatus in claim 29, wherein the processing circuitry is configured to jointly decorrelate the received radio antenna signals over space and time.

33. The compression apparatus in claim 29, wherein the multiple radio antenna signals are part of a coordinated multi-point communication, and wherein the transmitting is over one or more backhaul communications links.

34. The compression apparatus in claim 29, wherein the processing circuitry is configured to:
generate predictions of the multiple radio antenna signals;
determine associated error signals between the predicted multiple radio antenna signals and corresponding ones of the received multiple radio antenna signals; and
use the error signals to generate the compressed signal.

35. The compression apparatus in claim 29, wherein the processing circuitry is configured to:
transform the error signals using a linear spatial transform into spatially-transformed errors, and
quantize each of the spatially-transformed errors,
wherein the compressed signal includes the quantized, spatially-transformed errors.

36. The compression apparatus in claim 35, wherein the spatial linear transform includes fixed, predetermined transform coefficients corresponding to a discrete-cosine transform (DCT), a discrete Fourier transform (DFT), or a discrete wavelet transform (DWT).

37. The compression apparatus in claim 35, wherein the spatial linear transform includes adaptively computed transform coefficients, and wherein the transmitter is further configured to transmit the adaptively computed transform coefficients to the receiving node.

38. The compression apparatus in claim 35, wherein the processing circuitry is configured to quantize the spatially-transformed errors using a predetermined fixed number of bits.

39. The compression apparatus in claim 35, wherein one of more of the spatially-transformed errors is not quantized.

40. The compression apparatus in claim 35, wherein the processing circuitry is configured to:
quantize spatially-transformed errors using an adaptively selected number of bits that depends on corresponding variances of the spatially-transformed errors over time;
allocate a larger number of bits for quantizing a spatially-transformed error with a larger corresponding variance; and
allocate a smaller number of bits for quantizing a spatially-transformed error with a smaller corresponding variance.

41. The compression apparatus in claim 35, wherein the processing circuitry includes variable-rate quantizers configured to quantize the spatially-transformed errors.

42. The compression apparatus in claim 35, wherein the processing circuitry is configured to:
   quantize spatially-transformed errors using quantizers with uniform step or cell sizes; and
   encode the output of said quantizers with uniform step or cell sizes using entropy encoders.

43. The compression apparatus in claim 42, wherein the processing circuitry is configured to:
   calculate an error covariance matrix for the spatially-transformed errors using an empirical moving average computed over a window of time samples of the error signals;
   compute the eigen-decomposition of the said error covariance matrix; and
   use the resulting eigen-vectors from the eigen-decomposition to form a KLT coefficient matrix.

44. The compression apparatus in claim 35, wherein the processing circuitry is configured to quantize the spatially-transformed errors using an adaptively selected number of bits allocated to spatially-transformed errors, and
   the transmitter is configured to transmit the bit allocations for the spatially-transformed errors to the receiving node.

* * * * *